United States Patent [19]

Hertz

[11] 3,809,925

[45] May 7, 1974

[54] ANALOG-TO-DIGITAL CONVERTER LEVEL DETECTOR

[75] Inventor: Daniel Hertz, Framingham, Mass.

[73] Assignee: Raytheon Company, Lexington, Mass.

[22] Filed: Aug. 31, 1972

[21] Appl. No.: 285,176

[52] U.S. Cl. ................. 307/235, 307/286, 307/317, 330/30 D

[51] Int. Cl. ................. H03k 5/20

[58] Field of Search ....... 307/235, 235 A, 286, 317; 330/30 D

[56] References Cited

UNITED STATES PATENTS

| | | | |
|---|---|---|---|
| 3,046,543 | 7/1962 | Kaenel | 307/235 X |
| 3,216,005 | 11/1965 | Hoffman et al. | 307/235 X |
| 3,427,472 | 2/1969 | Karner | 307/235 |
| 3,436,560 | 4/1969 | Marchais | 307/235 X |
| 3,445,777 | 5/1969 | Amodei | 330/30 D |
| 3,456,128 | 7/1969 | Myers | 330/30 D |

*Primary Examiner*—John S. Heyman
*Attorney, Agent, or Firm*—Richard M. Sharkansky; Philip J. McFarland; Joseph D. Pannone

[57] ABSTRACT

An improved analog-to-digital (A/D) converter is disclosed wherein each one of a number of level detectors includes a tunnel diode buffered from an input signal through a differential amplifier and a hot carrier diode. The differential amplifier hot carrier diode buffering arrangement provides, inter alia, isolation between the tunnel diode and the other level detectors used in the A/D converter. The hot carrier diode switches from a low current quiescent condition to a high current quiescent condition as the tunnel diode switches between its pair of quiescent conditions. The gain provided by the differential amplifier, together with the current gain effect produced in switching the quiescent condition of the hot carrier diode, results in a level detector having a relatively high gain-bandwidth product.

1 Claim, 1 Drawing Figure

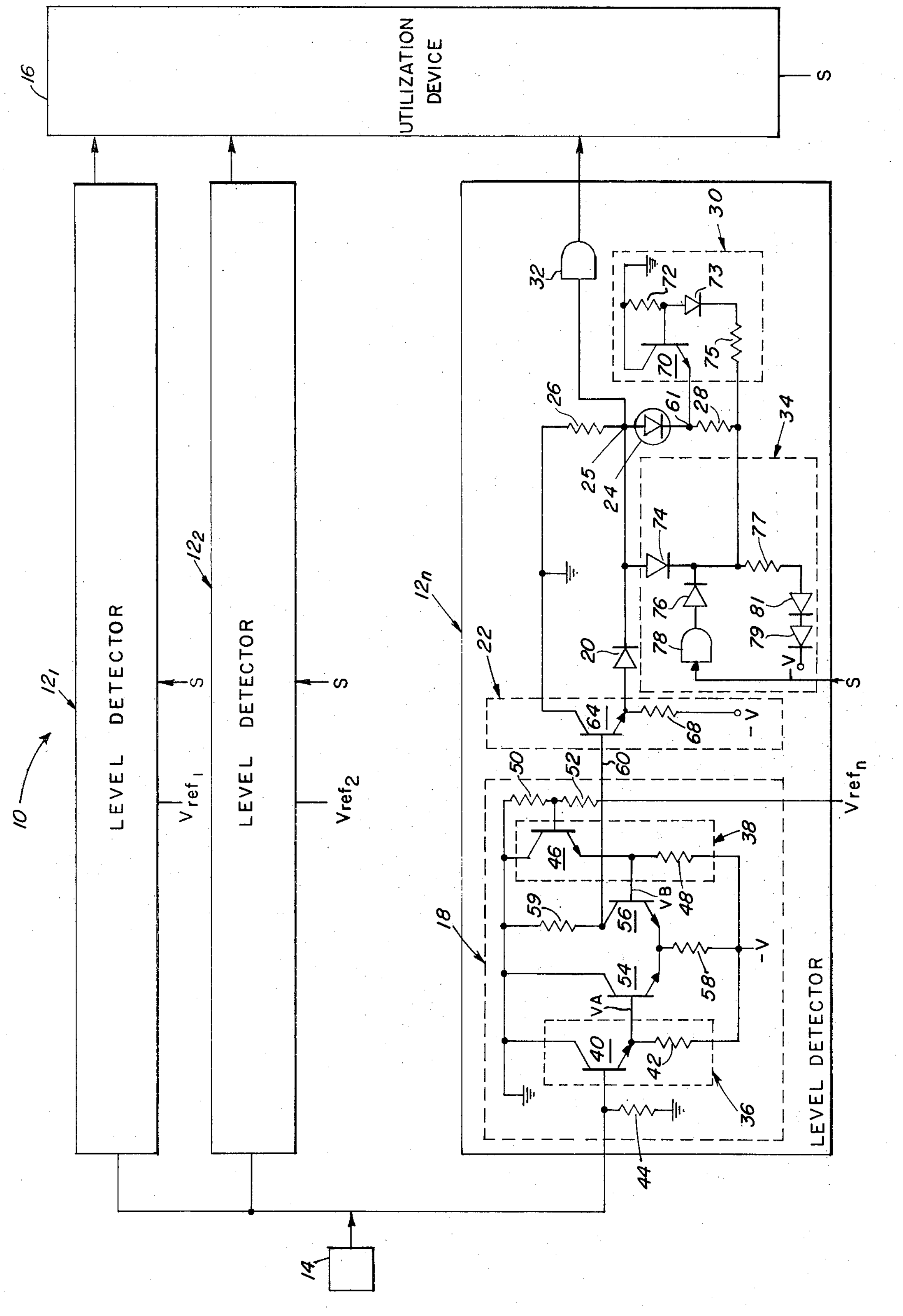
UTILIZATION DEVICE
LEVEL DETECTOR
LEVEL DETECTOR
LEVEL DETECTOR
S
$V_{ref_1}$
$V_{ref_2}$
$V_{ref_n}$
-V
VA
VB

ANALOG-TO-DIGITAL CONVERTER LEVEL DETECTOR

BACKGROUND OF THE INVENTION

This invention relates generally to voltage level detectors and more particularly to high speed voltage level detectors used in analog-to-digital converters.

As is known in the art, an analog-to-digital (A/D) converter generally is made up of a number of voltage level detectors, each one thereof connected to a common analog signal source and a common sampling signal source, each detector being set at a different threshold level to digitize the analog signal in response to each sample signal. The number of level detectors is determined by the number of bits desired to quantize the analog signal, i.e. one level detector per bit of quantization.

High speed level detectors are known to include a tunnel diode because of the fast switching characteristics of such an element. The tunnel diode is generally isolated from the signal source because, being a two terminal device, it has a common input-output terminal and its "output" condition must not effect the other level detectors making up the A/D converter. Isolation has generally been accomplished by interposing a back-biased diode and/or a resistor network between the analog signal source and the tunnel diode. While such arrangements have been found to provide adequate isolation in many applications, they have been found to be unsatisfactory in situations in which sampling rates up to 100 MHz are required, or in which the analog signal must be applied to a level detector having a relatively high ($\approx 20K\Omega$) input impedance or in which relatively high (1 per cent) resolution is required.

As is also known in the art, it is sometimes desirable to require the use of an A/D converter having a relatively high gain-bandwidth product, that is, a maximum detection resolution capability. One technique used to maximize the gain of a level detector is to bias the tunnel diode to operate at a low voltage quiescent point which is near the peak of its voltage-current (V-I) characteristic curve. A general rule sometimes applied in the design of such level detector is that for a 1 per cent detection resolution the tunnel diode must be biased one per cent lower than its peak voltage. This design leaves little tolerance and is generally undesirable because tolerances of ten per cent are sometimes required in the fabrication of such level detectors.

A further disadvantage of the level detectors discussed above is that they are not readily adaptable to operate for analog signals of both polarities. In particular, an A/D converter designed for operation with an analog signal of one polarity must generally have the tunnel diodes used therein reversed if the A/D converter is to be used with an analog signal having the opposite polarity. Such rewiring is obviously inconvenient and costly.

SUMMARY OF THE INVENTION

With this background of the invention in mind it is an object of this invention to provide an improved A/D converter, such A/D converter being capable of operating at sampling rates of the order of 100 MHz.

It is another object of the invention to provide an A/D converter wherein each one of a number of level detectors includes a tunnel diode, such diode being isolated from the analog input signal applied to such converter more effectively than has been known heretofore.

It is a further object of the invention to provide an A/D converter wherein each level detector used therein has a maximum gain bandwidth product.

It is still a further object of the invention to provide an A/D converter more adaptable for use with bi-polar analog signals.

These and many objects of the invention are attained generally by providing, in each of the level detectors of an A/D converter, a tunnel diode buffered from the analog signal source through a differential amplifier and a hot carrier diode. The differential amplifier is coupled to the analog signal source and a reference voltage source through different, relatively high impedance, emitter followers. The hot carrier diode and tunnel diode switch (when a sample signal is present) from a first quiescent state to a second quiescent state if the level of the analog signal is greater than a desired level established by the reference voltage. The hot carrier diode, having a lower resistance characteristic when operating in the second quiescent state as compared with the first quiescent state, provides additional gain and detection resolution for the level detector.

BRIEF DESCRIPTION OF THE DRAWING

The foregoing features of this invention, as well as the invention itself, may be more fully understood from the following detailed description read together with the accompanying drawing in which the FIGURE shows a schematic block diagram of an analog-to-digital converter according to the invention.

DESCRIPTION OF THE PREFERRED EMBODIMENTS

The Figure shows an analog-to-digital (A/D) converter 10 including a number of identical level detectors $\mathbf{12}_1$ to $\mathbf{12}_n$ (only one of such detectors being shown in detail). Each one of the level detectors is connected to an analog signal source 14, a utilization device 16, a sampling signal source S and a different voltage reference source $V_{ref_{1-n}}$.

Referring now to the exemplary one of the level detectors, say $\mathbf{12}_n$, such level detector is shown to include: a differential amplifier 18; a hot carrier diode 20 coupled to such differential amplifier through an emitter follower 22; a tunnel diode 24 coupled to the hot carrier diode at terminal 25, such diode further being biased by resistors 26, 28 and biasing network 30 (to be described); and, an emitter coupled logic (ECL) gate 32 connected between terminal 25 and the utilization device 16. A latching network 34 is coupled, as shown, between terminal 25 and the sampling signal source S.

The differential amplifier 18 includes a pair of emitter followers 36 and 38. Emitter follower 36 includes a transistor 40, the collector electrode thereof being connected to ground; the emitter electrode being connected to a −V power supply through a resistor 42; and the base electrode being connected to the analog signal source 14 and to ground through a resistor 44. Emitter follower 38 includes a transistor 46, the collector electrode being connected to ground; the emitter electrode being connected to the −V power supply through a resistor 48 and the base electrode being connected to ground through a resistor 50 and to the $V_{ref_n}$ power supply through a resistor 52. The emitter followers 36 through 38 provide a high input impedance to the analog signal and the voltage reference respectively and operate to establish a voltage VA and VB respectively at the emitter electrodes of transistors 40 and 46. The voltages VA and VB are applied to the base electrode of a different transistor 54 and 56, as shown. The transistors 54 and 56 have their emitter electrodes connected together to the −V power supply through a resistor 58, as shown. The collector electrode of transistor 54 is connected to ground. The collector electrode of transistor 56 is connected to ground through a resistor 59. The output signal of the differential amplifier 18 appears as a voltage on line 60, such line being connected to the collector electrode of line 56. When $V_A - V_B \approx 0$ the voltage on line 60 may be considered a threshold voltage having a voltage level such that (when latching network 34 is decoupled from terminal 25) the amount of current flowing through emitter follower 22 and hot carrier diode 20 to tunnel diode 24, in addition to the amount of current flowing to such tunnel diode through resistor 26, establishes a first quiescent condition, Q1, for both the hot carrier diode 20 and the tunnel diode 24. At this first quiescent condition Q1 the hot carrier diode 20 is biased at a point in the high resistance region of its V-I region and the tunnel diode 24 is biased at its low voltage quiescent point. When $V_A$ becomes greater than $V_B$ the current flowing through emitter follower 22 increases (because the voltage on line 60 increases positively assuming here that $V_{ref_n}$ is positive). This increase in current causes the hot carrier diode 20 and the tunnel diode 24 to switch from the first quiescent condition Q1 to a second quiescent condition Q2. At the second quiescent condition Q2 hot carrier diode 20 is biased to operate at a relatively low resistance region and tunnel diode 24 is biased at its high voltage condition. The switching of tunnel diode 24 from condition Q1 to Q2 produces a voltage change, say of approximately 1 volt, at terminal 25 which is coupled to ECL gate 32 because, for reasons to become apparent, biasing network 30 establishes a fixed voltage at terminal 61. Further, the switching of tunnel diode 24 from condition Q1 to condition Q2 establishes a voltage level at terminal 25 sufficient to back bias hot carrier diode 20. Therefore, tunnel diode 24 is maintained in the condition Q2 by current flow through resistor 26. That is, the output of level detector **12*n* may be considered as having switched from, say, a binary 0 condition to a binary 1 condition. ECL gate 32 provides gain and buffers the tunnel diode 24 from utilization device 16. Utilization device 16 is coupled to sampling signal source S and is here another processor. It is noted that, for reasons to become apparent, the signal supplied to the utilization device 16** represents the value of the analog signal only during the application of a sampling signal, S.

A little thought will make it apparent that the threshold level desired for level detector **12*n* is established by voltage $V_B$, and that such voltage $V_B$ is in turn established by the parameters $V_{ref_n}$ and resistors 50, 52. That is, $V_B \approx (V_{ref_n}) (R)/R_T$, where R is the resistance of resistor 50 and $R_T$ is the total resistance of resistors 50 and 52**.

Referring now in more detail to differential amplifier 18, it is first noted that such amplifier provides gain to the analog signal applied thereto. This gain is proportional to the resistance of resistor 59. Successful operation has been found with a differential amplifier having a gain of 4. The parameters providing such gain are as follows:

Resistors 42, 48 = 3K ohms
Resistor 58 = 392 ohms
Resistor 59 = 75 ohms
Transistors 40, 46 — Motorola MMT2857
Transistors 54, 56 — Motorola MD5835
$-V = -5.2$ volts
$V_{ref_n} = +5$ volts
Resistor 50 = 50 ohms
Resistor 52 = 0.5 to 5K ohms Such differential amplifier has an input impedance of approximately 20K ohms.

Emitter follower 22 includes a transistor 64, the base electrode being connected to line 60, the collector electrode being connected to ground, and the emitter electrode being connected to the −V power supply through resistor 68. A set of parameters compatible with those presented above for differential amplifier 18 are:

Transistor 64 — Motorola MMT 2857
Resistor 68 = 3K ohms

A hot carrier diode 20 and tunnel diode 24 found to be compatible with the differential amplifier 18 and emitter follower 22 are HP5082-2800 (Hewlett-Packard) and KMCA05005B (KMC Semiconductor Corp., Long Valley, N.J.), respectively. The ECL gate 32 is here a Motorola ECL gate 1660S.

Referring now in detail to biasing network 30, such network maintains the voltage at terminal 61 to a desired voltage level. A voltage level found satisfactory is −1.75 volts and is attainable by using for transistor 70 a Motorola MMT 2857 and resistors 72, 26, 28 of 392 ohms, a diode 73, and a resistor 75 of 1.5 K ohms. Such network 30 also provides for some degree of temperature compensation. Another biasing arrangement may be made by replacing biasing network 30 with a Zener diode and resistor connected in shunt with resistor 28. By selecting resistors 26 and 28 of 392 ohms, the voltage at terminal 25 at the first quiescent condition is −0.67 volts and at the second quiescent condition $Q_2$ is −1.67 volts. This provides a 1 volt swing between binary 1 and binary 0 and is therefore compatible with ECL gate 32.

Referring now in detail to latching network 34, such network is shown to include: a diode 74, here a hot carrier diode, the anode of which is connected to terminal 25 and the cathode of which is connected in common with the cathode of diode 76 and also to the −V power supply through resistor 77 (here 100 ohms) and a pair of diodes 79, 81. The anode of diode 76 is connected to the sampling signal source S through an ECL gate 78 (here a Motorola ECL gate 1660S) as shown. In the absence of a sampling signal, or here where the sampling signal is "low," diode 74 is forward biased and provides a low resistance path for the current passing through hot carrier diode 20. That is, diode 74 provides a path whereby substantially all of the current through diode 20 bypasses tunnel diode 24. This in effect disables tunnel diode 24 from responding to signals on line 60 so that the tunnel diode is latched at its first quiescent condition $Q_1$. When the sampling signal is "high" diode 74 becomes back biased and decoupled from terminal 25 thereby enabling the current passing through hot carrier diode 70 to pass through tunnel diode 24. Therefore, in such "unlatched" condition the condition of tunnel diode 24 may switch in accordance with the level of the threshold signal on line 60.

The dynamic range of the analog signal applied to level detector 12*n* may be, for the specific design presented, 0 to +0.5 volts. If the $V_{ref_n}$ is changed from +5 volts to −5 volts the dynamic range of such analog signal may be 0 to −0.5 volts. Therefore, because of merely selecting the polarity of $V_{ref}$ the level detector may easily be adapted to process bipolar analog signals.

While the invention has been particularly shown and described with reference to the preferred embodiments thereof, it will now be understood by those skilled in the art that the foregoing and other changes in form and details may be made therein without departing from the spirit and scope of the appended claims.

I claim:

1. In combination:

a. diode means having a high resistance characteristic and a low resistance characteristic;

b. a bistable switching element, such element being connected to a voltage source through a first and a second electrical path, the diode means being disposed in the first electrical path;

c. means for driving the diode means from the high resistance characteristic to the low resistance characteristic when the level of an analog signal exceeds a threshold level; and d. means for biasing the bistable switching element at a first quiescent condition and for enabling such bistable element to switch to a second quiescent condition as the diode means is driven from the high resistance characteristic to the low resistance characteristic, including means for backbiasing the diode means when the bistable element is switched to the second quiescent condition.

* * * * *